United States Patent
El-Chammas

(10) Patent No.: US 9,013,344 B2
(45) Date of Patent: Apr. 21, 2015

(54) HIGH SPEED DYNAMIC COMPARATOR

(71) Applicant: Texas Instrutments Incorporated, Dallas, TX (US)

(72) Inventor: Manar I. El-Chammas, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/282,053

(22) Filed: May 20, 2014

(65) Prior Publication Data

US 2014/0347204 A1 Nov. 27, 2014

Related U.S. Application Data

(60) Provisional application No. 61/827,434, filed on May 24, 2013.

(51) Int. Cl.
*H03M 1/12* (2006.01)
*H03F 3/45* (2006.01)

(52) U.S. Cl.
CPC ............. *H03M 1/12* (2013.01); *H03F 3/45071* (2013.01); *H03F 2203/45451* (2013.01)

(58) Field of Classification Search
USPC .................... 341/155, 161, 120; 323/313, 314
See application file for complete search history.

(56) References Cited

U.S. PATENT DOCUMENTS

| | | | | |
|---|---|---|---|---|
| 4,843,348 A | * | 6/1989 | Fenk | 331/109 |
| 7,319,314 B1 | * | 1/2008 | Maheshwari et al. | 323/313 |
| 7,501,887 B2 | * | 3/2009 | Stephelbauer et al. | 330/51 |

* cited by examiner

*Primary Examiner* — Brian Young
(74) *Attorney, Agent, or Firm* — Alan A. R. Cooper; Frank D. Cimino

(57) ABSTRACT

A comparator circuit (FIG. 4) is disclosed. The circuit includes an amplifier circuit (300,302) arranged to produce an output signal (Vom,Vop). A first current source (312) is arranged to produce a first current through the amplifier circuit. A detector circuit (400) is arranged to produce a control signal (404) in response to a level of the output signal. A second current source (402) is arranged to produce a second current through the amplifier circuit in response to the control signal.

17 Claims, 7 Drawing Sheets

HIGH SPEED DYNAMIC COMPARATOR

CLAIM TO PRIORITY OF NONPROVISIONAL APPLICATION

This application claims the benefit under 35 U.S.C. §119(e) of Provisional Appl. No. 61/827,434 (TI-72935PS), filed May 24, 2013, which is incorporated herein by reference in its entirety.

BACKGROUND OF THE INVENTION

Embodiments of the present invention relate to a high speed, low power dynamic amplifier circuit for analog circuit applications.

Analog-to-digital conversion is used in a wide variety of electronic devices to convert analog signals to digital domain signals. This conversion facilitates signal processing for a variety of applications such as digital communications, medical imaging, digital video, xDSL cable modems, and fast Ethernet. There are a variety of analog-to-digital converter (ADC) circuits for various applications. For example, successive approximation register (SAR) circuits or oversampling sigma-delta ADCs may be desirable for low sampling rates. Flash ADCs may be desirable for higher sampling rates. Pipelined ADC circuits, however, have become the most popular architecture for sampling rates of a few megasamples per second (Msps) to more than 100 Msps. Moreover, pipelined ADCs may include plural stages of Flash ADCs.

FIG. 1 is a typical 12-bit pipelined ADC circuit of the prior art. The ADC circuit includes four 3-bit stages 100-106 and a time alignment and error correction circuit 108. Stages 2-4 (102-106) are similar to stage 1 (100) as shown in detail. Stage 1 is coupled to receive analog input signal Vin. Sample-and-hold circuit 110 samples Vin at a predetermined clock frequency and applies the samples to 3-bit ADC circuit 112 and to sum circuit 116. ADC circuit 112 produces the three most significant bits (MSBs) of the 12-bit digital word and applies them to circuit 108. The three MSBs are also applied to 3-bit digital-to-analog (DAC) circuit 114. DAC 114 applies an analog version of the three MSBs to sum circuit 116. The analog version of the three MSBs is subtracted from the held analog version of Vin to produce a residue signal. The residue signal is then amplified by four (×4) by residue amplifier 118 and applied to stage 2 (102). The process continues in subsequent stages until all 12 bits of the digital words are resolved. An important advantage of the pipelined ADC is that stage 1 can receive and process new samples of input signal Vin as soon as the residue signal is received by the sample-and-hold circuit of stage 2.

FIG. 2 is an exemplary 3-bit ADC circuit 112 of the prior art. The circuit includes eight resistors connected in series between voltage sources V+ and V− to produce respective reference voltages $V_{R6}$ through $V_{R0}$. Each reference voltage is applied to one input terminal of a respective comparator, such as comparators 202-204. A second input terminal of each comparator is coupled to receive input signal Vin. A corresponding 3-bit digital output signal is shown on the right. For example, if Vin is greater than reference voltage $V_{R6}$, the 3-bit digital output is 111. If Vin is greater than reference voltage $V_{R5}$ and less than $V_{R6}$, the 3-bit digital output is 110. A problem occurs, however, when the input voltage is near a reference voltage. For example, when Vin is slightly more than $V_{R3}$ and less than $V_{R4}$, a small difference voltage V3 is applied to the input terminals of comparator 202. By way of comparison, a greater difference voltage V4 is applied to comparator 200. Likewise, a greater difference voltage V2 is also applied to comparator 204. In a similar manner, all other comparators receive a greater difference voltage than comparator 202. The problem is that comparator 202 may remain in a metastable state due to the small difference voltage while other comparators switch to their final states. Thus, comparator 202 is subjected to noise from other comparators of the array while its final state remains undetermined. Thus, comparator 202 may produce one or more bit errors in the pipeline ADC.

Referring to FIG. 3, there is a simplified circuit diagram of a comparator circuit of the prior art that may be used in the comparator array of FIG. 2. The comparator circuit includes an amplifier circuit formed by NPN transistors 300 and 302, n-channel transistor 304, and load resistors $R_L$. The comparator circuit also includes a latch circuit formed by NPN transistors 306 and 308, n-channel transistor 310, and output resistors $R_O$ as indicated. A current source 312 is coupled to the common source terminal of n-channel transistors 304 and 310. In operation, when clock signal CLK is low and complementary clock signal /CLK is high, n-channel transistor 304 is on and the amplifier circuit is enabled. N-channel transistor 310 is off, and the latch circuit is disabled. Plus input signal Vip is applied to the base of NPN transistor 300, and minus input signal Vim is applied to the base of NPN transistor 302. Input transistors 300 and 302 produce corresponding output signals Vom and Vop. When complementary clock signal /CLK goes low and clock signal CLK goes high, the amplifier circuit is disabled by n-channel transistor 304 and the latch circuit is enabled by n-channel transistor 310. NPN transistors 306 and 310 latch the state of output signals Vom and Vop received from the amplifier circuit. If output signals from the amplifier circuit are in a metastable or undetermined state, however, they may be latched in an incorrect state or even remain in an undetermined state. The comparator gain may be increased and the corresponding amplifier time constant decreased by increasing the current through current source 312. This has the disadvantage of increasing power consumption as well as array noise. The period of clock signal CLK may also be increased, thereby providing more time for the amplifier circuit to amplify the difference voltage between Vip and Vim. Of course, this has the disadvantage of reducing speed of the ADC.

While preceding approaches may provide improvements in ADC speed and throughput, the present invention is directed to further improvements in speed, throughput, and an improved error rate. Accordingly, the preferred embodiments described below are directed toward improving upon the prior art.

BRIEF SUMMARY OF THE INVENTION

In a preferred embodiment of the present invention, a comparator circuit is disclosed. The comparator circuit includes an amplifier circuit arranged to produce an output signal. A first current source is arranged to produce a first current through the amplifier circuit. A detector circuit is arranged to produce a control signal in response to a level of the output signal. A second current source is arranged to produce a second current through the amplifier circuit in response to the control signal.

DETAILED DESCRIPTION OF THE INVENTION

The preferred embodiments of the present invention provide significant advantages over analog-to-digital (ADC) circuits of the prior art as will become evident from the following detailed description.

Figure 1:
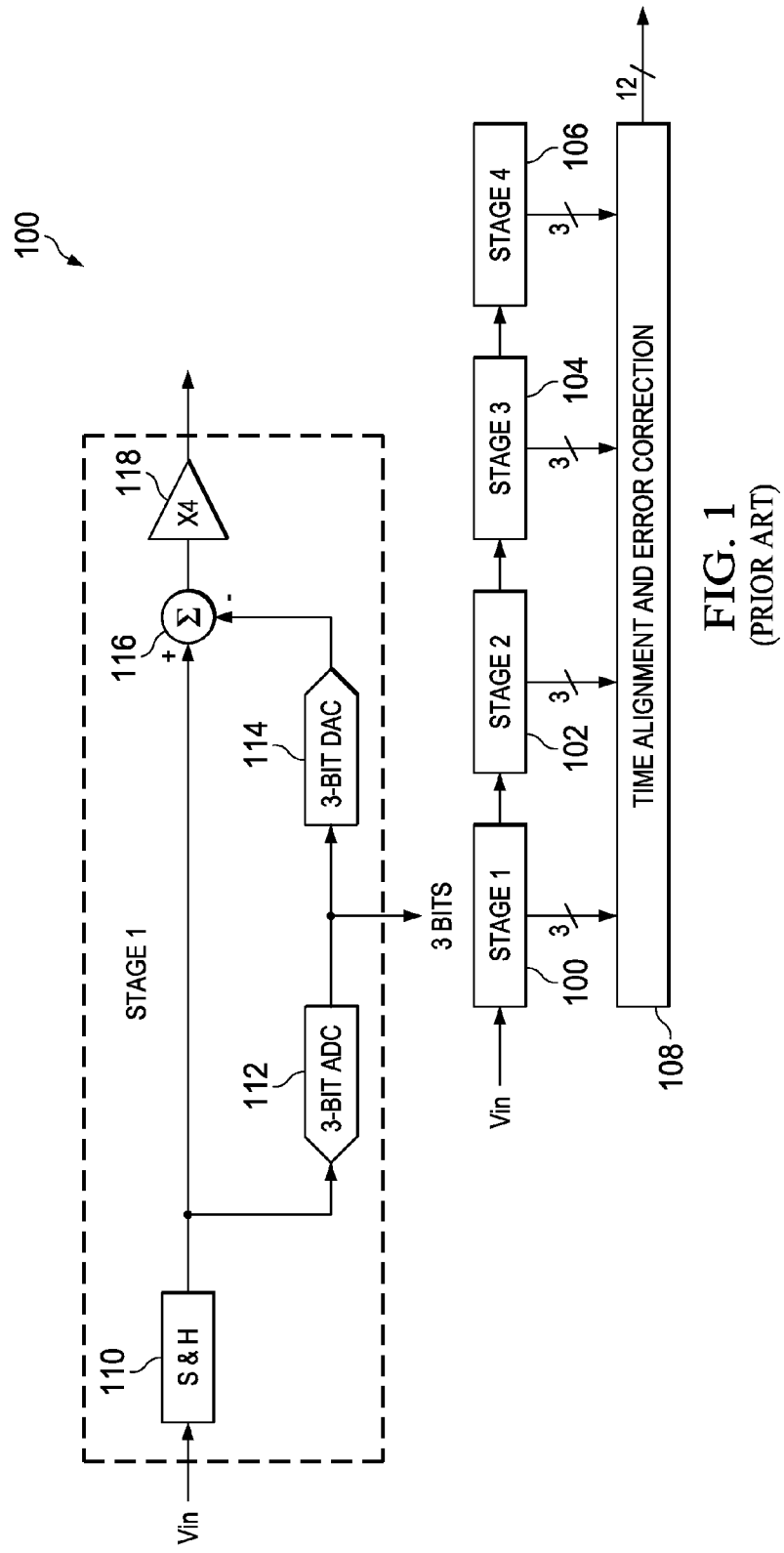
FIG. 1 is a circuit diagram of a pipelined analog-to-digital (ADC) circuit of the prior art.
Figure 2:
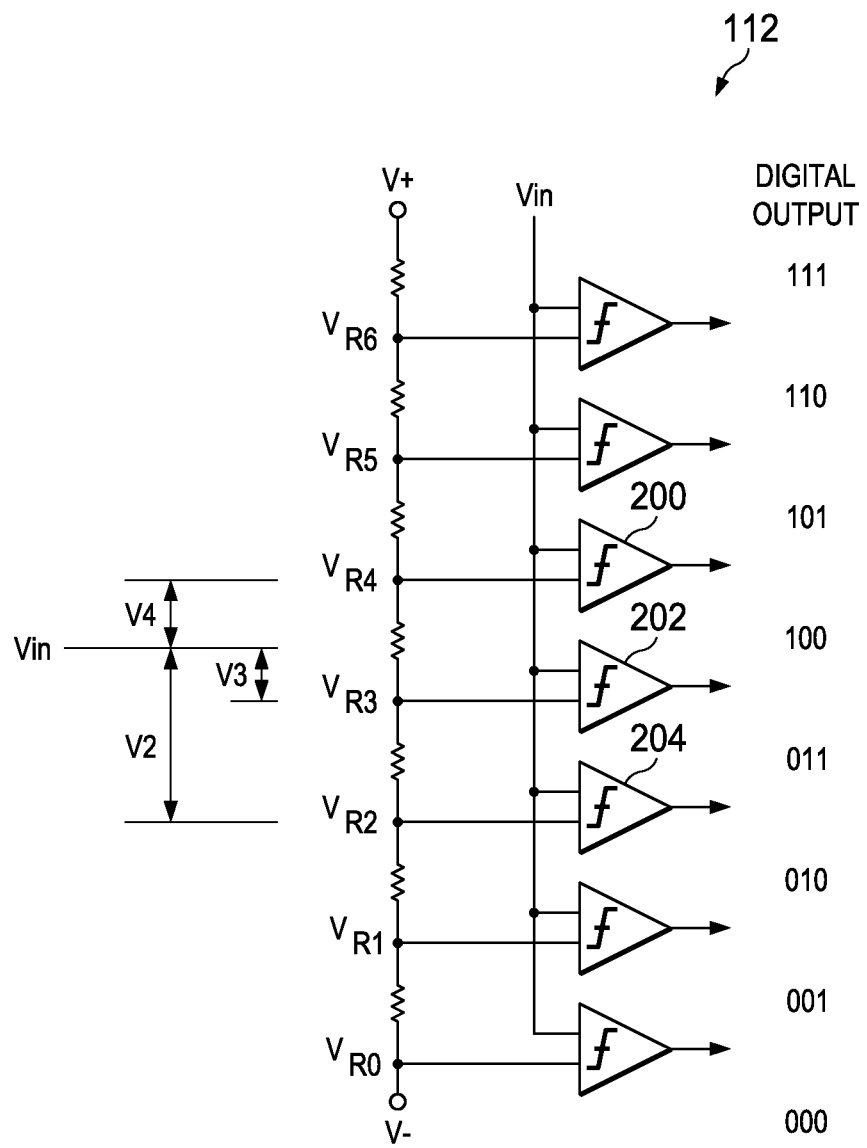
FIG. 2 is a circuit diagram of a 3-bit ADC circuit of the prior art as in FIG. 1.
Figure 3:
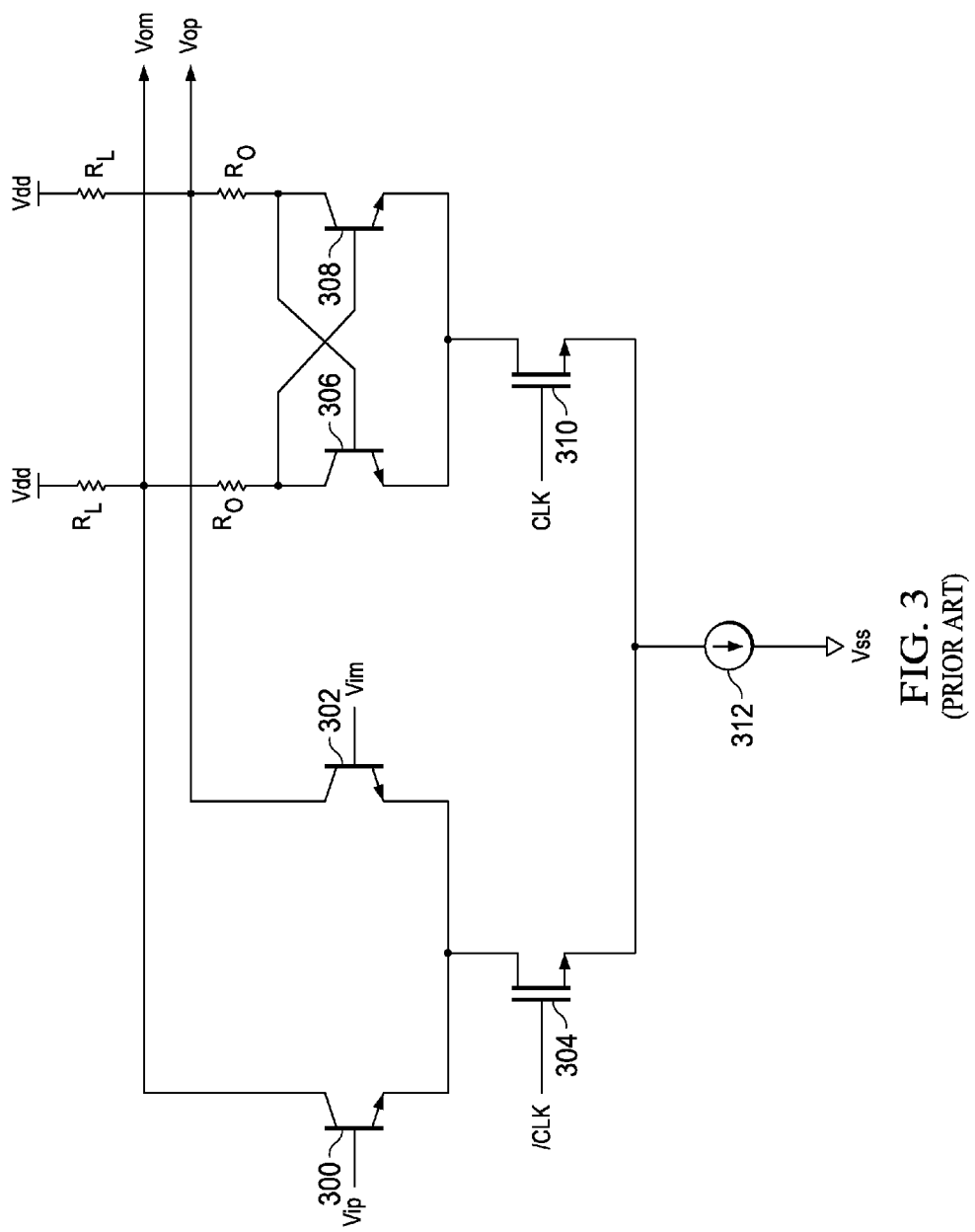
FIG. 3 is a circuit diagram of a comparator circuit of the prior art as in the 3-bit ADC circuit of FIG. 2.
Figure 4:
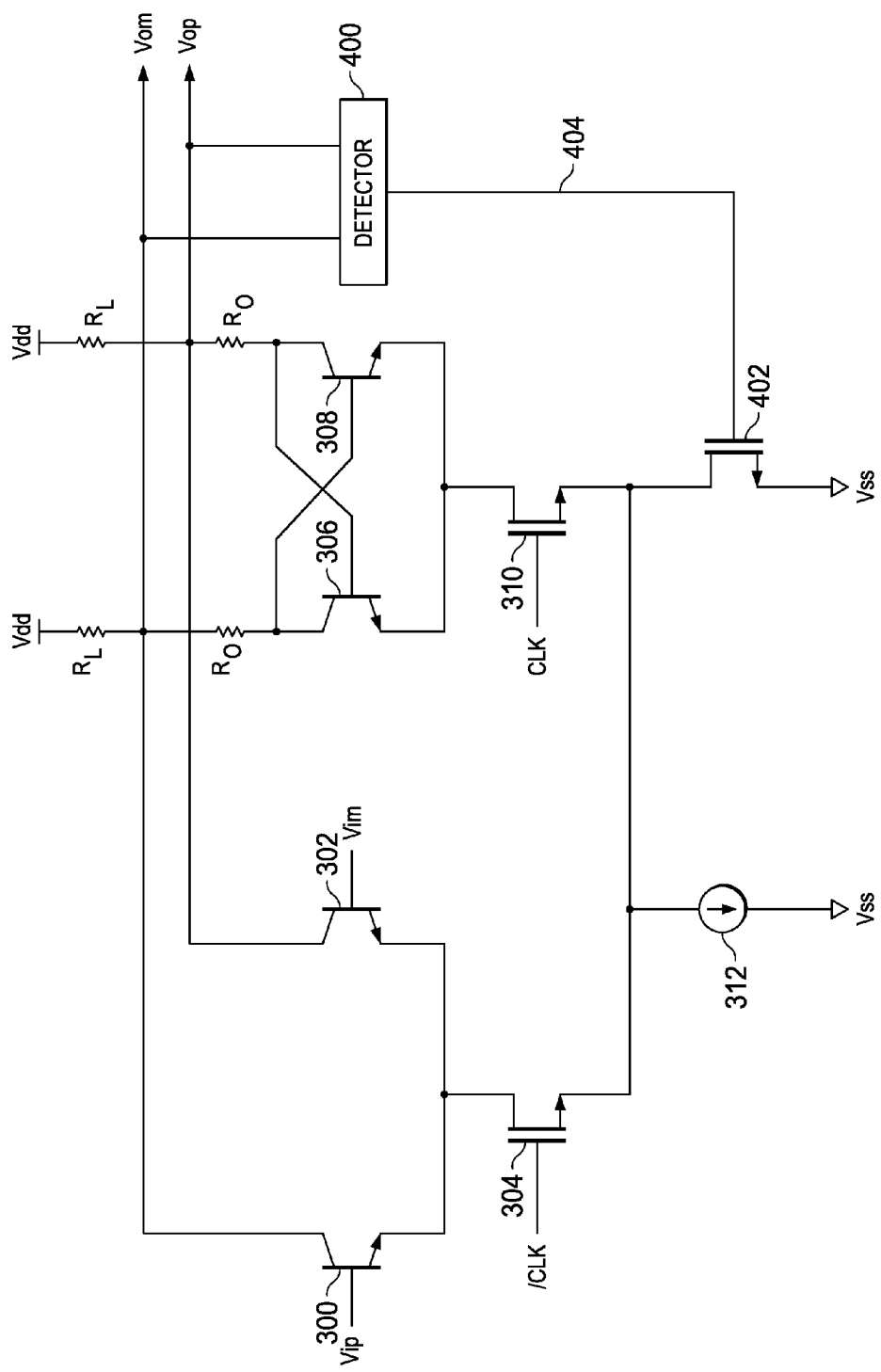
FIG. 4 is a circuit diagram of a first embodiment of a comparator circuit of the present invention.

Referring to FIG. 4, there is a circuit diagram of a first embodiment of a comparator circuit of the present invention that may be used in the comparator array of FIG. 2 and the pipelined ADC of FIG. 1. Here and in the following discussion, the same reference numerals are used to identify similar circuit elements in the drawing figures. The comparator circuit includes an amplifier circuit formed by NPN transistors 300 and 302 and a latch circuit formed by NPN transistors 306 and 308. A common emitter terminal of transistors 300 and 302 is selectively coupled to current source 312 by n-channel switching transistor 304. The amplifier circuit produces complementary output signals Vom and Vop at the collector terminals of transistors 300 and 302, respectively. A detector circuit 400 is coupled to receive output signals Vom and Vop and produce a control signal on lead 404 in response to a level of the output signals. The control signal selectively turns on n-channel transistor 402 to provide a second current through the amplifier circuit in response to the control signal. A latch circuit formed by cross-coupled NPN transistors 306 and 308 is a regenerative amplifier. The latch circuit is selectively coupled to the drain terminal of n-channel transistor 402. The source terminal of n-channel transistor 402 is coupled to power supply terminal Vss or ground as indicated by the small triangle.

In operation, clock signal CLK is initially low and complementary clock signal /CLK is high. Minus output voltage Vom and plus output voltage Vop are initially equal. A reference voltage is applied to the base of one of NPN input transistors 300 and 302 and an input voltage such as Vin is applied to the other of NPN input transistors 300 and 302. Here, the reference and input voltages are referred to as plus input voltage Vip and minus input voltage Vim to emphasize the differential relation of the input signals. The high level of complementary clock signal /CLK turns on n-channel switching transistor 304 so that current source 312 provides a bias current through the amplifier circuit. Detector circuit 400 receives output signals Vom and Vop and produces an exclusive NOR (XNOR) control signal on lead 404. The XNOR function produces a low output in response to different inputs and a high output in response to substantially the same inputs. The output signals are initially equal, so an XNOR of Vom and Vop produces a high level control signal on lead 404. This high level control signal is preferably a controlled bias voltage that is slightly greater than a threshold voltage of n-channel transistor 402. N-channel transistor 402, therefore, operates in saturation mode as a second current source for the amplifier circuit. One of ordinary skill in the art will appreciate that an NPN bipolar transistor may be substituted for n-channel transistor 402. Current source 312 and the n-channel transistor 402 current source both initially provide bias current to the amplifier circuit. The combined bias current from both current sources quickly amplifies and regenerates the input voltage difference between Vim and Vip and produces an output voltage difference between Vom and Vop. Detector 400 produces a low level control signal on lead 404 in response to the level of the amplified difference voltage between Vom and Vop. The low level control signal turns off n-channel transistor 402, thereby reducing the bias current through the amplifier and latch circuits.

After output signals Vom and Vop are sufficiently amplified, clock signal CLK goes high, and complementary clock signal /CLK goes low. The low level of /CLK turns off n-channel transistor 304, thereby disconnecting the amplifier circuit from current source 312. The high level of CLK turns on n-channel transistor 310, thereby connecting the common emitter terminal of latch transistors 306 and 308 to current source 312. The latch circuit latches and further amplifies the difference voltage between Vom and Vop. For example, if Vop is more positive than Vom, base current through NPN transistor 306 is greater than base current through NPN transistor 308. Thus, Vom is driven low and Vop is pulled high by respective load ($R_L$) and output ($R_O$) resistors.

For the case where the differential input signal is small, the amplifier circuit (300, 302) may not sufficiently resolve the metastable signal state when clock signal CLK goes high, and complementary clock signal /CLK goes low. In this case, detector 400 continues to produce a high level control signal on lead 404, and n-channel transistor 402 continues to operate as the second current source. The latch circuit (306, 308) operates as a regenerative amplifier with current source 312 and n-channel current source 402. The latch circuit further amplifies the input signal to resolve the metastable state with a sufficient output signal level. When detector 400 detects a sufficient difference voltage between Vom and Vop, it produces a low level control signal on lead 404 in response to the level of the amplified difference voltage. The low level control signal turns off n-channel transistor 402, thereby reducing the bias current through the latch circuit.

The present invention offers several advantages over comparator circuits of the prior art. First, the amplifier of each comparator circuit of a comparator array (FIG. 2) will initially receive a bias current from two current sources to quickly amplify an input difference voltage. Second, comparators with larger input difference voltages will produce suitable output voltage levels before comparators with smaller input difference voltages. These larger output difference voltage levels are detected, and one of the current sources is disabled, thereby reducing power consumption and noise. Third, comparators with smaller input difference voltages will continue to operate at a higher bias current level to overcome any metastable state and produce suitable output difference voltage levels. Fourth, each comparator circuit of the comparator array operates independently of other comparators. Each comparator reverts to a low current mode when a respective output voltage signal is developed. Finally, error rates are greatly reduced, since metastable comparator states are resolved by higher amplifier and latch circuit bias current.

Figure 5:
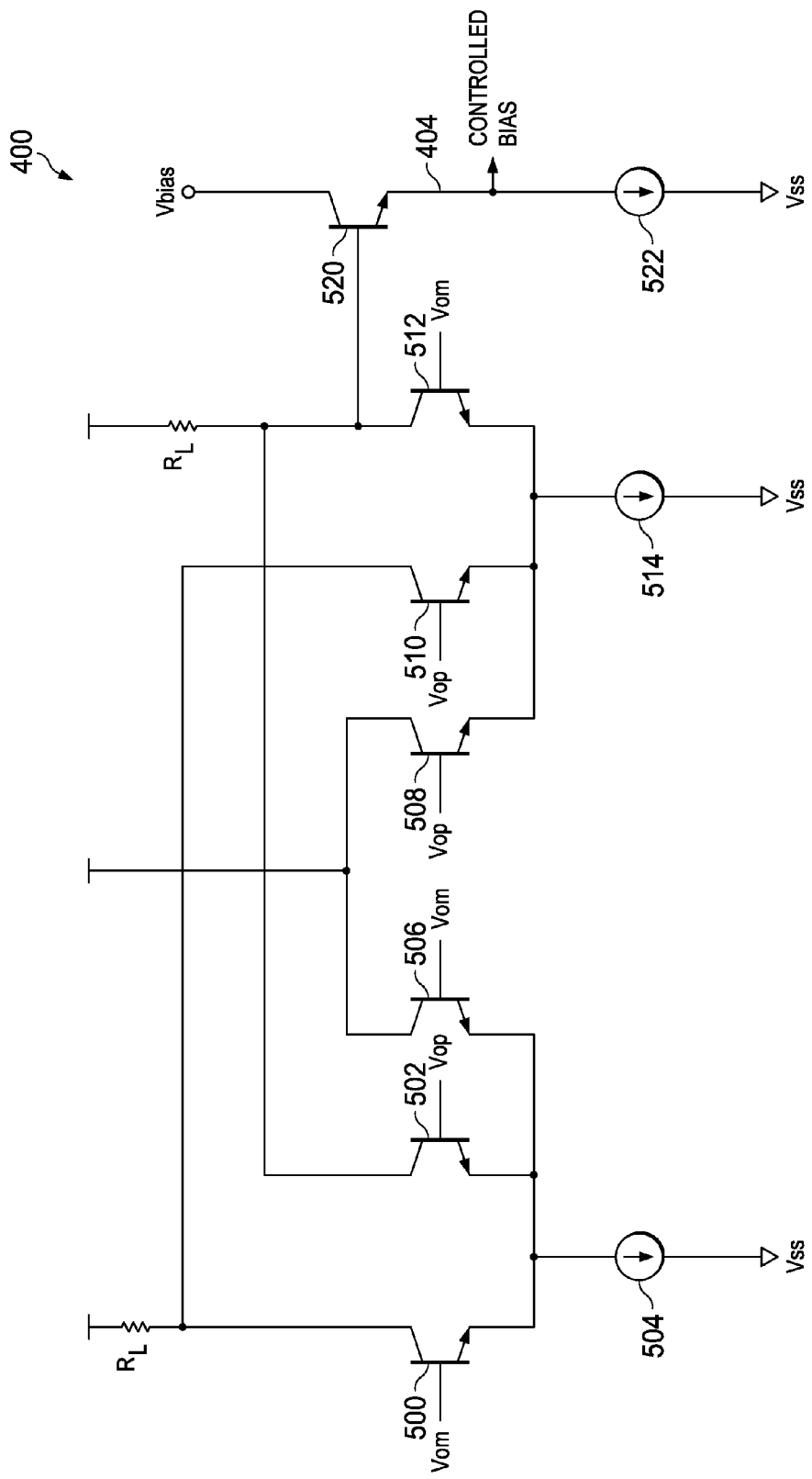
FIG. 5 is a circuit diagram of an exclusive NOR (XNOR) detector circuit that may be used with the comparator circuit of FIG. 4, 6, 7A, or 7B.

Turning now to FIG. 5, there is a circuit diagram of an exclusive NOR (XNOR) detector circuit 400 that may be used with the comparator circuit of FIG. 4, 6, 7A, or 7B. Although this embodiment of the XNOR is implemented in bipolar logic, one of ordinary skill in the art will appreciate that the XNOR function may be implemented in complementary metal oxide semiconductor (CMOS) logic, bipolar and CMOS (BiCMOS) logic, or other semiconductor logic. The XNOR circuit includes a left branch including NPN transistors 500 and 502 and current source 504, a right branch including NPN transistors 510 and 512 and current source 514, and an emitter follower circuit including NPN transistor 520 and current source 522. As previously discussed, the XNOR function produces a low output in response to different inputs and a high output in response to substantially the same inputs. In operation, when Vop and Vom are both low, NPN transistors 500 through 512 are off. Load resistor $R_L$ pulls the collector of NPN transistor 512 high. This high level produces base current in NPN transistor 520 and a controlled bias voltage on lead 404. Alternatively, when Vop and Vom are both high, NPN transistors 506 and 508 produce a current approximately equal to current sources 504 and 514, respectively. Thus, substantially no current flows through NPN transistors 502 or 512, and load resistor $R_L$ pulls the collector of NPN transistor 512 high. This high level produces base current in NPN transistor 520 and a controlled bias voltage on lead 404.

When Vop is high and Vom is low, transistors 500, 506, and 512 are off. Transistor 508 produces a current approximately equal to current source 514. Thus, substantially no current flows through transistor 510. Transistor 502 pulls the collector of transistor 512 and base of transistor 520 low, and lead 404 goes low. Alternatively, when Vop is low and Vom is high, transistors 502, 508, and 510 are off. Transistor 506 produces a current approximately equal to current source 504. Thus, substantially no current flows through transistor 500. Transistor 512 pulls the base of transistor 520 low, and lead 404 goes low.

Figure 6:
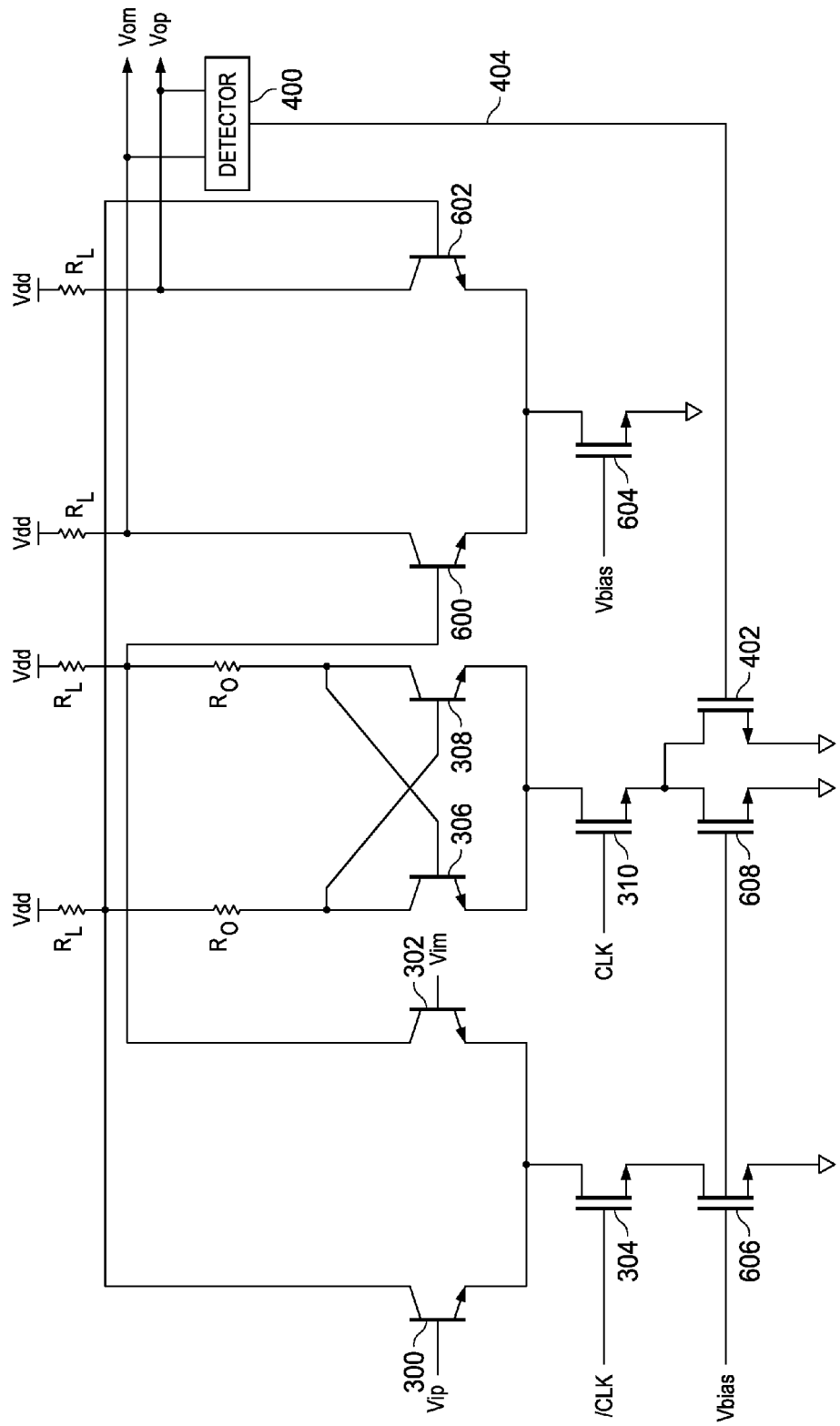
FIG. 6 is a circuit diagram of a second embodiment of a comparator circuit of the present invention.

Referring now to FIG. 6, there is a circuit diagram of a second embodiment of a comparator circuit of the present invention. This circuit is similar to the comparator circuit of FIG. 4, except an inverting buffer circuit including NPN transistors 600 and 602 and n-channel transistor 604 is added. The gate of n-channel transistor 604 is controlled by a bias voltage that is slightly greater than the threshold voltage of n-channel transistor 604. Thus, transistor 604 operates in saturation as a current source. The collector of NPN transistor 300 is connected the base of NPN transistor 602, and the collector of NPN transistor 302 is connected to the base of NPN transistor 600. This embodiment of the present invention provides all the advantages of the embodiment of FIG. 4. In addition, the inverting buffer circuit advantageously isolates the latch circuit from any noise imparted to the output leads. Moreover, n-channel transistor 604 operates as a separate current source from the amplifier and latch circuits to decouple its behavior from the amplifier and latch circuits. Detector circuit 400 operates in the same manner as previously described with regard to FIG. 4 except that minus output signal Vom is taken from the collector of transistor 600 and plus output signal Vop is taken from the collector of transistor 602.

Figure 7B:
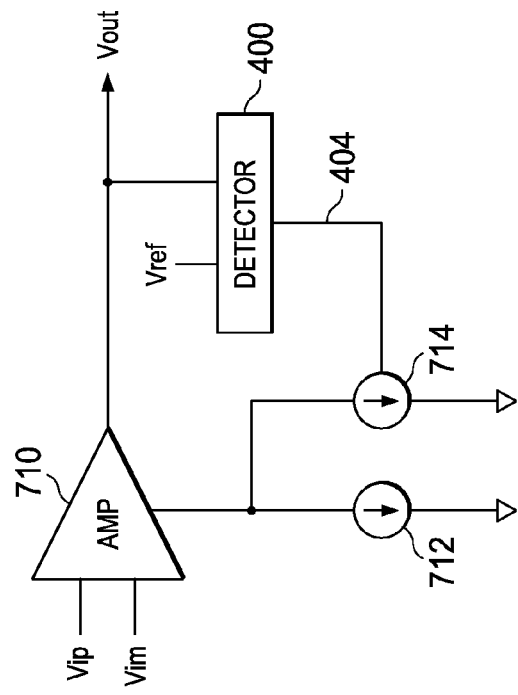
FIG. 7B is a circuit diagram of an amplifier circuit according to a fourth embodiment of the present invention.
Figure 7A:
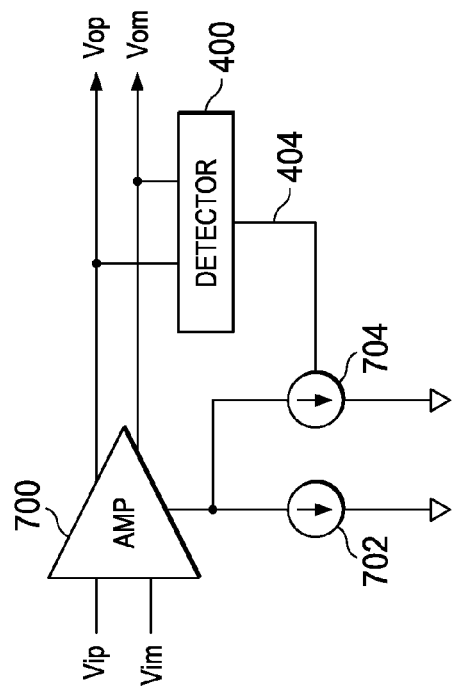
FIG. 7A is a circuit diagram of an amplifier circuit according to a third embodiment of the present invention.

Turning now to FIG. 7A, there is a circuit diagram of an amplifier circuit according to a third embodiment of the present invention. This embodiment of the present invention may advantageously be applied to other circuits of the pipelined ADC such as the residue amplifier 118 (FIG. 1). Amplifier 700 receives differential input signals Vim and Vip and produces differential output signals Vom and Vop. Detector 400 operates as previously described with regard to FIG. 4 and produces an XNOR output on lead 404. In operation, when output signals Vop and Vom are substantially equal, current sources 702 and 704 provide a bias current to quickly amplify the input signal. However, when the differential output signal is sufficiently amplified, detector 400 produces a low level control signal on lead 404 to turn off current source 704. Thus, amplifier 700 quickly amplifies the input signal in response to a combined bias current from current sources 702 and 704. Once the output signal reaches a suitable level, current source 704 is turned off, thereby reducing power consumption and noise.

FIG. 7B, is a circuit diagram of an amplifier circuit according to a fourth embodiment of the present invention. This embodiment of the present invention may advantageously be applied to other circuits having a single ended output signal. Amplifier 710 receives differential input signals Vim and Vip and produces output signal Vout. Detector 400 operates as previously described with regard to FIG. 4 except that one input is coupled to receive output signal Vout, and the other input is coupled to receive reference voltage Vref. Here, the reference voltage Vref is preferably equal to a precharge level of Vout prior to amplification. In operation, when reference voltage Vref and output signal Vout are substantially equal, current sources 712 and 714 provide a bias current to quickly amplify the input signal. However, when the output signal Vout is sufficiently amplified, detector 400 produces a low level control signal on lead 404 to turn off current source 714. Thus, amplifier 710 quickly amplifies the input signal in response to a combined bias current from current sources 712 and 714. Once the output signal reaches a suitable level, current source 714 is turned off, thereby reducing power consumption and noise.

Still further, while numerous examples have thus been provided, one skilled in the art should recognize that various modifications, substitutions, or alterations may be made to the described embodiments while still falling within the inventive scope as defined by the following claims. For example, although embodiments of the present invention are specifically directed to a pipelined ADC circuit, one of ordinary skill in the art having access to the instant specification will appreciate that the present invention may be applied to many amplifying circuits. Other combinations will be readily apparent to one of ordinary skill in the art having access to the instant specification.

What is claimed is:

1. A circuit, comprising:
   an amplifier circuit arranged to produce an output signal;
   a first current source arranged to produce a first current through the amplifier circuit;
   a detector circuit arranged to produce a control signal in response to a level of the output signal;
   a second current source arranged to produce a second current through the amplifier circuit in response to the control output signal,
   a latch circuit arranged to latch the output signal;
   a first switching transistor coupled between the amplifier circuit and the first current source; and
   a second switching transistor coupled between the latch circuit and the first current source.

2. A circuit as in claim 1, comprising a latch circuit arranged to latch the output signal.

3. A circuit as in claim 1, wherein the first switching transistor is controlled by a complementary clock signal, and wherein the second switching transistor is controlled by a clock signal.

4. A circuit as in claim 1, wherein the output signal comprises a differential output signal, and wherein the control signal is an exclusive NOR (XNOR) of the differential output signal.

5. A circuit as in claim 1, wherein the control signal is an exclusive NOR (XNOR) of the output signal and a reference voltage.

6. A circuit as in claim 1, comprising a buffer circuit coupled to receive and amplify the output signal, wherein the detector circuit is coupled to receive the amplified output signal.

7. A circuit as in claim 1, comprising a comparator circuit of an analog-to-digital converter.

8. A circuit as in claim 1, comprising a residue amplifier of an analog-to-digital converter.

9. A method of producing an output signal from an amplifier, comprising:
    detecting a level of the output signal;
    producing a first current and a second current through the amplifier in response to a first level of the output signal; and
    producing only the first current through the amplifier in response to a second level of the output signal,
    wherein the output signal is a differential output signal comprising a plus and a minus signal, and wherein the step of detecting comprises producing an exclusive NOR of the plus and minus signals.

10. A method as in claim 9, wherein the second level is greater in magnitude than the first level.

11. A method as in claim 9, wherein the step of detecting comprises producing an exclusive NOR of the output signal and a reference voltage.

12. A method as in claim 9 comprising latching the output signal when it has a magnitude greater than the second level.

13. A method as in claim 9, comprising:
    producing the first current in response to a first clock signal; and
    producing the second current in response to the step of detecting.

14. An analog-to-digital converter (ADC), comprising:
    an amplifier circuit arranged to produce an output signal;
    a first current source arranged to produce a first current through the amplifier circuit;
    a detector circuit arranged to produce a control signal in response to a level of the output signal; and
    a second current source arranged to produce a second current through the amplifier circuit in response to the control output signal,
    a latch circuit arranged to latch the output signal;
    a first switching transistor coupled between the amplifier circuit and the first current source; and
    a second switching transistor coupled between the latch circuit and the first current source.

15. An ADC as in claim 14, wherein the first switching transistor is controlled by a complementary clock signal, and wherein the second switching transistor is controlled by a clock signal.

16. An ADC as in claim 14, wherein the output signal comprises a differential output signal, and wherein the control signal is an exclusive NOR (XNOR) of the differential output signal.

17. An ADC as in claim 14, wherein the control signal is an exclusive NOR (XNOR) of the output signal and a reference voltage.

* * * * *